United States Patent [19]
Walden

[11] Patent Number: 6,049,236
[45] Date of Patent: Apr. 11, 2000

[54] DIVIDE-BY-ONE OR DIVIDE-BY-TWO QUALIFIED CLOCK DRIVER WITH GLITCH-FREE TRANSITIONS BETWEEN OPERATING FREQUENCIES

[75] Inventor: Robert William Walden, Bethlehem, Pa.

[73] Assignee: Lucent Technologies Inc., Murray Hill, N.J.

[21] Appl. No.: 08/971,434

[22] Filed: Nov. 17, 1997

[51] Int. Cl.$^7$ .................................................... H03K 17/00
[52] U.S. Cl. .............................. 327/99; 327/115; 327/117
[58] Field of Search ........................ 377/47, 48; 327/115, 327/117, 116, 99, 113, 165, 166

[56] References Cited

U.S. PATENT DOCUMENTS

| | | | |
|---|---|---|---|
| 4,445,215 | 4/1984 | Svendsen | 370/517 |
| 5,379,038 | 1/1995 | Matsumoto | 341/101 |
| 5,552,732 | 9/1996 | Huang | 327/116 |
| 5,563,594 | 10/1996 | Ford et al. | 341/100 |

*Primary Examiner*—Kenneth B. Wells
*Assistant Examiner*—Minh Nguyen

[57] ABSTRACT

A method and system for a clock driver is described which can buffer an master clock directly, or generate a output clock signal having a balanced duty cycle which is the input clock frequency divided by a predetermined value. When a frequency control input, such as a rate signal, is switched, the clock output makes a glitchless transition from one frequency to the other. The clock driver includes a counter divider circuit with feedback to produce two signals related by a predetermined phase difference. The counter divider circuit employs predetermined logic delays by buffered gating controlled by the master clock, which produces two signals. These two signals act as "enable" control signals such that the timing of their rising and falling edges is arranged to never propagate through the clock divider circuit to become the edges of output clock. The master clock is gated with these two signals to provide two unbalanced signals which are synchronous to the input clock signal. In addition, these two unbalanced signals have waveforms such that they may then be logically combined to form a single, balanced signal in a glitchless manner. Furthermore, transitions between fast, slow, and disable modes of operation for such clock driver circuit are also synchronous with the master clock and glitchless.

28 Claims, 5 Drawing Sheets

DIVIDE-BY-ONE OR DIVIDE-BY-TWO QUALIFIED CLOCK DRIVER WITH GLITCH-FREE TRANSITIONS BETWEEN OPERATING FREQUENCIES

FIELD OF THE INVENTION

The present invention relates in general to digital timing circuits, and, more particularly, to improvements in a clock circuit providing clock signals at different frequencies.

BACKGROUND OF THE INVENTION

Figure 1A:
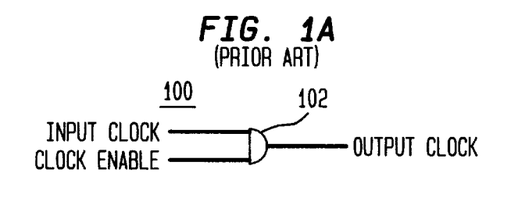
FIG. 1A illustrates a clock circuit of the prior art providing two clock frequencies.
Figure 1B:
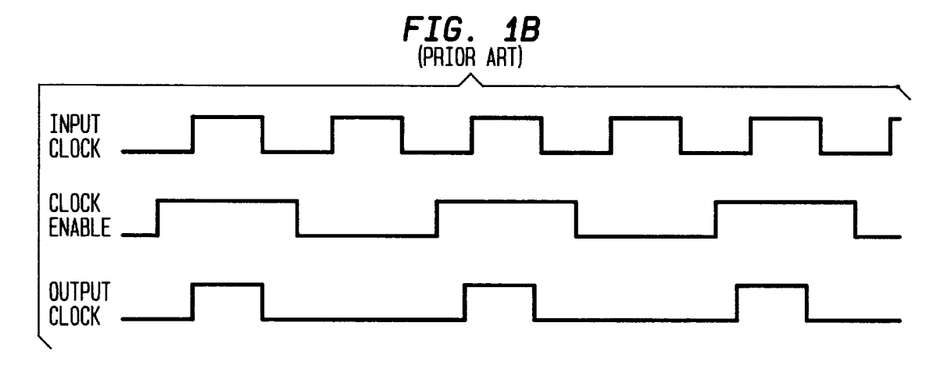
FIG. 1B is a timing diagram illustrating the operation of the prior art clock circuit of FIG. 1A.

In many digital circuits, it is desirable to have a clock which will provide clock signals having two or more different frequencies, and these clock signals may also be synchronous with an external master clock. Many of these applications relate to circuits implemented with integrated circuits (ICs), Typical clock circuits of the prior art gate a clock driver with an enable signal which inhibits some of the positive-going (or negative-going) clock pulses. FIG. 1A illustrates a clock circuit 100 of the prior art providing two clock frequencies. As shown in FIG. 1A, an INPUT CLOCK signal and CLOCK ENABLE signal are provided to input terminals of AND gate 102 to provide an OUTPUT CLOCK signal. FIG. 1B is a timing diagram illustrating the operation of the clock circuit of FIG. 1A. For example, to divide the effective clock frequency by two, the CLOCK ENABLE signal inhibits every other positive-going clock pulse. However, the clock waveform of the OUTPUT CLOCK signal of such a circuit provides an asymmetric clock duty cycle. The asymmetry is of little concern in many applications; and if the pulse width provides sufficient propagation time for highest frequency of operation, it will be sufficient at lower frequencies as well.

Some circuit applications, such as analog circuits implemented on ICs, may be more sensitive to large asymmetries in duty cycle. In these applications, selection of different clock rates permits active tradeoff between speed and performance provided that the clock duty cycle remains balanced, or symmetric. For example, a data converter of an IC may be capable of higher resolution and/or lower power operation with low clock speed, provided the clock phases (and thus settling times) remain reasonably balanced. However, a symmetric clock circuit should be implemented with a simple circuit, similar to current clock driver circuits, to minimize complexity, power use, and IC real estate.

Therefore, there is a need for a clock driver circuit which is capable of buffering a master clock directly or generating a sub-harmonic clock with a balanced, or symmetric, duty-cycle. Furthermore, transitions between fast, slow, and disable modes of operation for such clock driver circuit should be glitchless and synchronous with a master clock signal.

SUMMARY OF THE INVENTION

The present invention relates to an apparatus and method for a clock circuit which provides a selected one of a first and a second clock signal corresponding to a first and a second state of a rate signal. The clock circuit includes a dividing circuit for generating first and second timing signals derived from a master clock signal and the rate signal. Further, the clock circuit includes a (1) first logic combination to combine the first timing signal with the master clock signal to provide a first signal portion synchronous to the master clock signal; and a second logic combination to combine the second timing signal with an inverted master clock signal to provide a second signal portion synchronous to the master clock signal. Finally, the clock driver circuit includes a third logic combination to combine the first and second signal portions to provide the first clock signal when the rate signal is in the first state, and to provide the second clock signal when the rate signal is in the second state, wherein the second clock signal is a sub-harmonic of the master clock signal and has a balanced duty cycle.

BRIEF DESCRIPTION OF THE DRAWINGS

The aforementioned features and benefits of the invention will be better understood from a consideration of the detailed description which follows taken in conjunction with the accompanying drawings, in which.

DETAILED DESCRIPTION

A method and system for a clock driver is described which can buffer a master clock directly, or generate an output clock signal having a balanced duty cycle which is the master clock divided by a predetermined value. When the frequency control input is switched, the clock output makes a transition from one frequency to the other. The clock driver includes a counter divider circuit with feedback to produce two signals related by a predetermined phase difference. The counter divider circuit employs predetermined logic delays by buffered gating controlled by the master clock, to produce the two signals. These two signals act as enable control signals such that the timing of their rising and falling edges is arranged to never propagate through the clock divider circuit to become the edges of output clock. The master clock is gated with these two signals to provide two unbalanced signals which are synchronous to the input clock signal. In addition, these two unbalanced signals have waveforms such that they may then be logically combined to form a single, balanced signal in a glitchless manner. Furthermore, transitions between fast, slow, and disable modes of operation for such clock driver circuit are also synchronous with the master clock and glitch-less.

Figure 2:
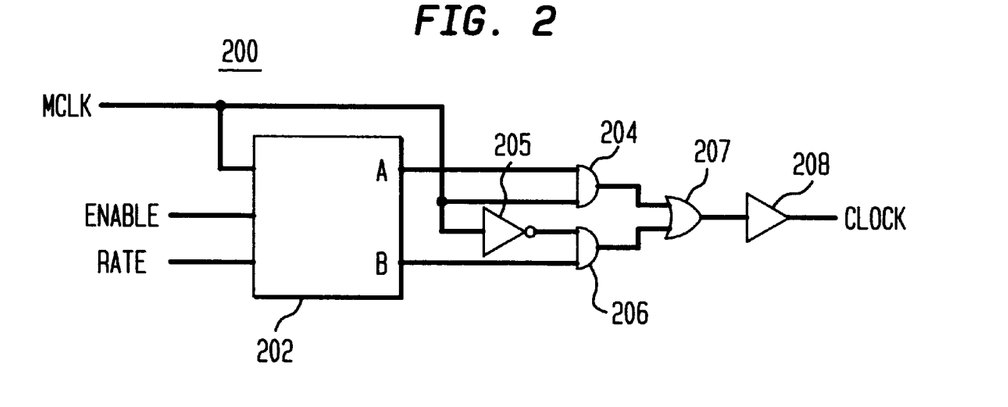
FIG. 2 is a diagram illustrating an exemplary embodiment of a clock driver circuit in accordance with the present invention.

FIG. 2 is a circuit diagram illustrating an exemplary embodiment of a clock driver circuit 200 in accordance with the present invention. The clock divider circuit 200 includes a counter/divider circuit 202, AND gates 204 and 206, inverter 205, OR gate 207 and optional driver amplifier 208. A system clock signal MCLK, ENABLE and RATE are provided to input terminals of clock divider circuit 200. The signal ENABLE enables clock divider circuit operation and the signal RATE controls whether the clock divider circuit 200 buffers or divides the system clock MCLK to provide the output clock signal CLOCK.

The preferred embodiment of the present invention provides the signal CLOCK having a balanced duty cycle by forming the signal CLOCK from two signals A and B, derived from the signals MCLK, ENABLE and RATE which are subsequently gated with, and synchronized to, the system clock MCLK.

Counter/divider circuit 202 provides signal A which is combined by logic operation in AND gate 204 with MCLK, and signal B which is combined by logic operation in AND gate 206 with an inverted MCLK signal from inverter 205. Clock divider circuit 200 then provides the output clock signal CLOCK as a logic combination from OR gate 207 of the resulting two signals from AND gates 204 and 206, respectively. Consequently, the output clock signal CLOCK may be expressed as the logic combination given in equation 1:

$$\text{CLOCK} = (A \cdot \text{MCLK} + B \cdot \overline{\text{MCLK}}) \quad (1)$$

where A and B are the output signals of the counter divider circuit 202.

Signals A and B act as control signals; the timing of their rising and falling edges is arranged such that they never propagate through the clock divider circuit 200 to become the edges of output clock signal CLOCK. Instead, the logic combination of A with MCLK and B with $\overline{\text{MCLK}}$ in AND gates 204 and 206 results in timing edges of the output clock signal CLOCK of OR gate 207 being timed by the edges of the master clock signal MCLK. In addition, the logic delays are such that the two short positive-going pulses of A·MCLK and B·$\overline{\text{MCLK}}$ overlap slightly to form a single glitchless output pulse of the signal CLOCK. Optional driver amplifier 208 is used to drive circuits which follow the clock driver circuit according to the present invention.

Figure 3A:
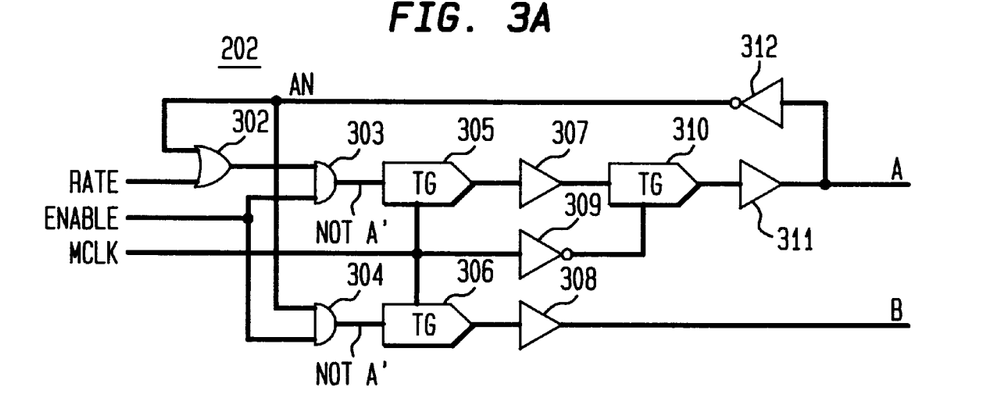
FIG. 3A is a diagram illustrating an exemplary embodiment of a counter/divider circuit suitable for use with the circuit of FIG. 2.

FIG. 3A is a diagram illustrating an exemplary embodiment of the counter/divider circuit 202 of FIG. 2 which provides the control signals A and B. The signal path for signal A of counter divider 202 incudes an OR gate 302, AND gate 303, a first transmission gate (TG) 305 with buffer 307, a second (TG) 310 with buffer 311, and inverter 312. The signal path for signal B of counter divider 202 includes AND gate 304, and a third TG 306 with buffer 308. As will be apparent to those skilled in the art, the TG and buffer combinations 305 and 307, 310 and 311, and 306 and 308 respectively may be used in the preferred embodiment if the circuit employs CMOS logic. However, the present invention is not limited to this configuration, and these TG-buffer combinations may be implemented as, for example, sample and hold circuits or flip-flops.

When the ENABLE control signal is set to logic 0 at the input terminals of AND gates 303 and 304 of FIG. 3, both AND gates 303 and 304 provide logic 0, regardless of the other values provided to their input terminals. Consequently, both A and B remain logic 0, and, therefore, so does the output CLOCK, independent of RATE.

When the ENABLE control signal is set to logic 1, the signal path for signal A and B is as follows for fast and slow rates. First, in a fast rate of operation where RATE is logic 1, the clock divider circuit of FIG. 2 simply buffers the master clock signal MCLK. Referring to FIG. 3A, the OR gate 302 provides a logic 1 when RATE is logic 1, and the AND gate 303 provides logic 1 which is eventually transferred through TGs 305 and 310 to the output of buffers 307 and 311. Since the AND gate 304 receives the inverted signal A, AND gate 304 provides a logic 0, which is eventually transferred through TG 306 to buffer 308 as signal B having logic 0. Consequently, referring to FIG. 2, the signal A remains logic 1 while signal B remains logic 0, causing MCLK to be provided by AND gate 204 to one input terminal of OR gate 207, and also as CLOCK from OR gate 207 since the signal from AND gate 206 to the other input terminal of OR gate 207 is always logic 0.

Figure 4A:
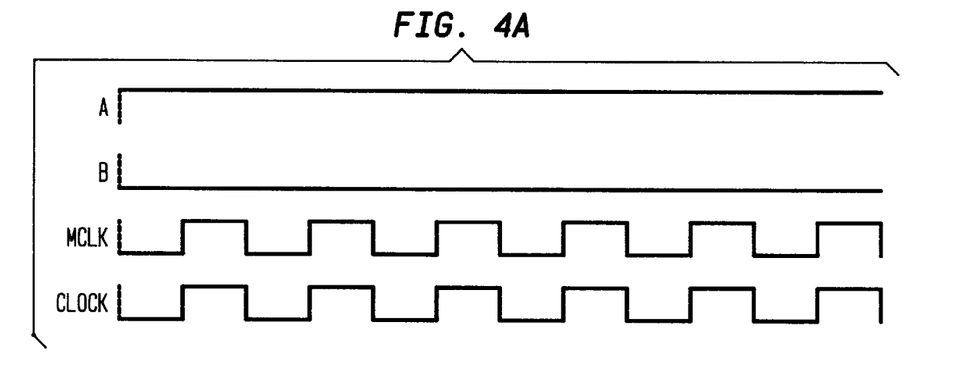
FIG. 4A is a timing diagram illustrating input and output signals in accordance with the exemplary embodiment of the present invention shown in FIG. 2 in which a master clock signal is buffered.

FIG. 4A is a timing diagram illustrating input and output signals in accordance with the exemplary embodiment of the present invention shown in FIG. 2 in which a master clock signal is buffered. As previously described, in the fast rate mode of operation, where RATE is logic 1, signal A remains logic 1 while signal B remains logic 0. Thus, MCLK propagates directly through the counter divider circuit 202, AND gate 204 and OR gate 207 to be output clock signal CLOCK.

Second, in a slow rate of operation where RATE is logic 0, the clock divider circuit of FIG. 2 provides a balanced clock signal CLOCK which has a frequency one half of the frequency of the master clock signal MCLK (MCLK/2). This is accomplished by providing signals A and B with a clock cycle of MCLK/2, and signal A lags signal B by a quarter cycle of the frequency of signals A and B. To understand generation of a one quarter signal phase delay between signals A and B, the operation of the TGs 305, 310 and 306 under control of MCLK is described with reference to FIG. 3A.

First, the current output logic level of signal A is inverted by inverter 312 and provided to AND gates 303 and 304, which in turn provide the signal concurrently to TGs 305 and 306 as NOT A' since ENABLE is logic 1. Note also that the logic level of the signal from inverter 312, which is also equivalent to NOT A', always propagates through OR gate 302 because RATE is logic 0. Once the signal MCLK transitions to logic 1, the TGs 305 and 306 transfer the current value of NOT A' to buffers 307 and 308. At the same time, MCLK transitions to logic 0 at output terminal of inverter 309, disabling TG 310, holding the previous value of buffer 307, which is the previous value of NOT A'. Next, when MCLK transitions to logic 0, MCLK transitions to logic 1 at output terminal of inverter 309, enabling TG 310 and passing the current value of NOT A' to buffer 311 as signal A, which is one half MCLK cycle later than when the current value of NOT A' passes to buffer 308 as signal B. Since two MCLK clock cycles are necessary to make a current logic value of signal A be inverted and cycled through counter/divider 202, signals A and B each have a frequency of MCLK/2. Consequently, this one half MCLK cycle delay through TG 310 causes transitions of signal A to occur later than the corresponding transition of signal B by one quarter cycle of the frequency of signals A and B.

Figure 4B:
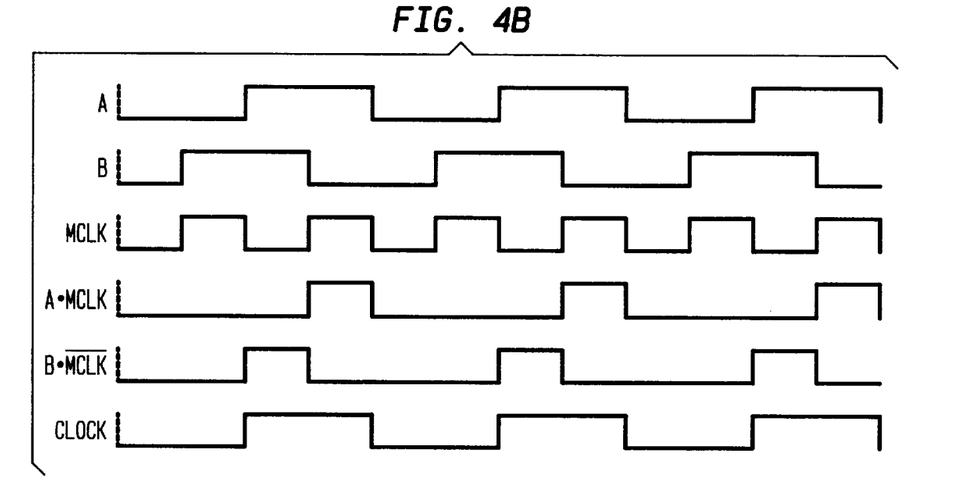
FIG. 4B is a timing diagram illustrating input and output signals in accordance with the exemplary embodiment of the present invention shown in FIG. 2 in which a master clock signal is divided by two.

FIG. 4B is a timing diagram illustrating input and output signals in accordance with the exemplary embodiment of the present invention shown in FIG. 2 in which a master clock signal is divided by two. Control signals A and B both make transitions at half the master clock rate, but ¼ cycle out of phase with each other. B rises ½ MCLK cycle before A rises, as seen in FIG. 4B, but both A and B are each combined with the same pulse of MCLK, forming unbalanced signals (A AND MCLK) and (B AND MCLK) whose transitions are synchronized to MCLK. As stated previously, the output clock signal CLOCK is formed by the logic combination of (A AND MCLK) OR (B AND MCLK), which creates CLOCK having a balanced duty cycle synchronized to MCLK.

Figure 3B:
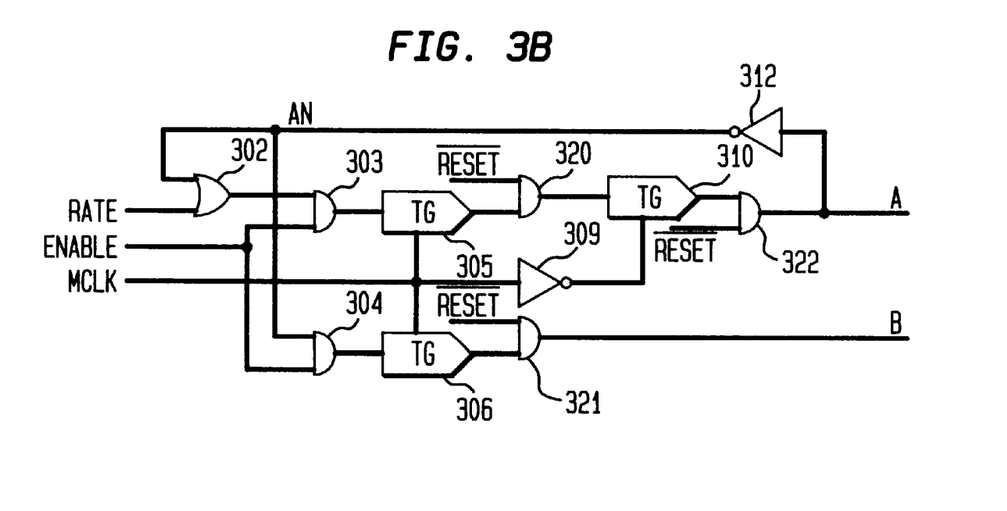
FIG. 3B is a diagram illustrating an alternative embodiment of a counter/divider circuit suitable for use with the circuit of FIG. 2.

FIG. 3B is a diagram illustrating an alternative embodiment of the counter/divider circuit of FIG. 2. An asynchronous reset which initializes the clock divider circuit and sets the signal CLOCK to a constant logic value may be implemented by substituting AND gates 320, 321 and 322 for the three non-inverting driving buffers 307, 308 and 311 of FIG. 3A. Each of the AND gates 320, 321 and 322 is provided a RESET signal at a respective input terminal, and by logic combination of the input signals with RESET in AND gates 320, 321 and 322 are either passed or set to a fixed logic value to reset the counter/divider 202. For the exemplary embodiment of FIG. 3B, a reset of the counter/divider circuit is asserted by the RESET signal being a logic 1, which inversion sets one input value of each AND gate to a logic 0. This operation sets the output signals A and B of AND gates 320, 321 and 322 to a fixed logic 0, which causes the output signals of AND gates 204 and 206 of FIG. 2 to be the fixed logic 0, and, consequently, sets the output of OR gate 207 to a logic 0.

Figure 5:
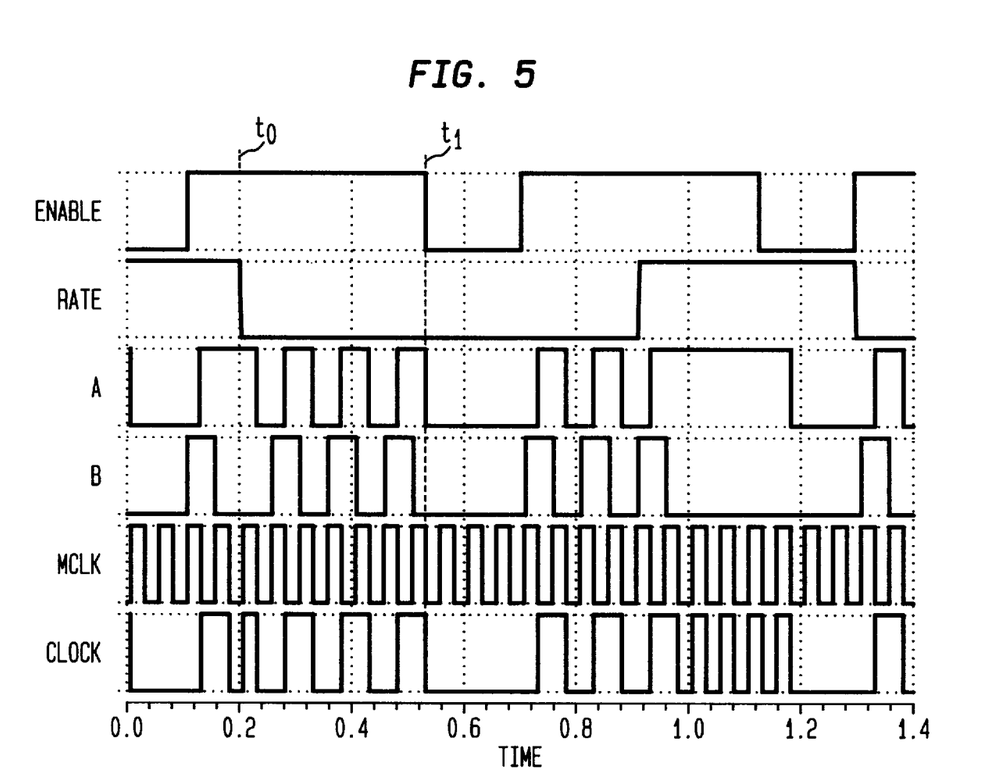
FIG. 5 illustrates a simulation of the input and output signals of an implementation of the clock driver circuit of FIG. 2 used in accordance with the present invention showing glitch-free transitions between clock frequencies of an output signal CLOCK.

Because all transitions of A and B are gated by the edges of MCLK, transitions in the output signal CLOCK are glitchless even when ENABLE or RATE control signals are changed asynchronously. FIG. 5 illustrates a simulation of the input and output signals of an implementation of the clock driver circuit of FIG. 2 used in accordance with the present invention. For example, at time $t_0$ (time 0.2), ENABLE is logic 1, and RATE transitions from logic 1 to logic 0, in which case CLOCK switches frequency from MCLK to MCLK/2. As shown, the transition is glitch-free between the clock frequencies. Further, at time $t_1$ (approximately time 0.52) ENABLE transitions from logic 1 to logic 0, setting the CLOCK signal to logic 0 in a glitch-free manner.

Figure 6A:
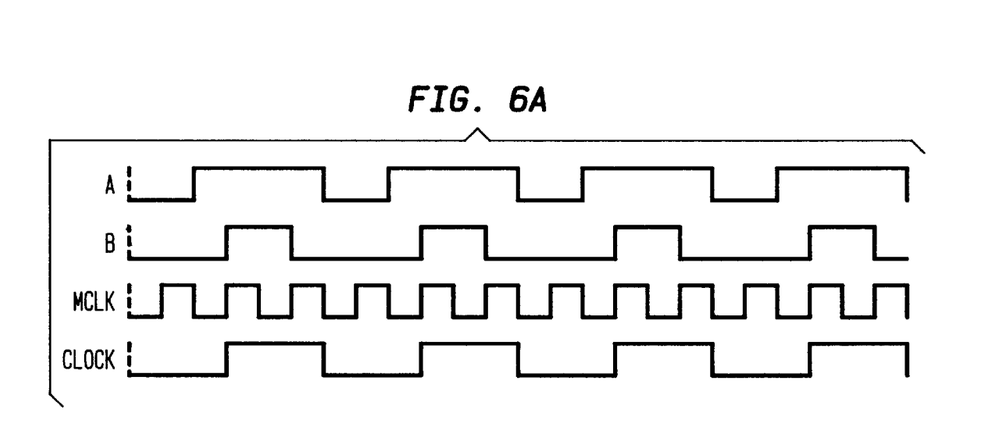
FIG. 6A is a timing diagram illustrating input and output signals in accordance with a further exemplary embodiment of the present in which a master clock signal is divided by three.

As would be apparent to one skilled in the art, the clock circuit of the present invention may be extended to higher frequency division ratios and to switching among multiple frequency clocks. For example, the counter/divider circuit of FIG. 2 which generates the A and B control signals may be modified. FIG. 6A is a timing diagram illustrating input and output clock signals and including the A and B signal waveforms, in accordance with another exemplary embodiment of the present invention similar to that shown in FIG. 2 in which a master clock signal is divided by three. As illustrated in FIG. 6A, signals A and B are designed such that signal A has an unbalanced duty cycle of three clock periods. The B signal is an inverted A signal having a leading edge shifted by half of one master clock cycle. Consequently, the B signal extends the logic 0 portion and decreases the logic 1 portion of signal A's duty cycle by one half master clock cycle such that the resultant signal CLOCK has a balanced duty cycle.

Figure 3C:
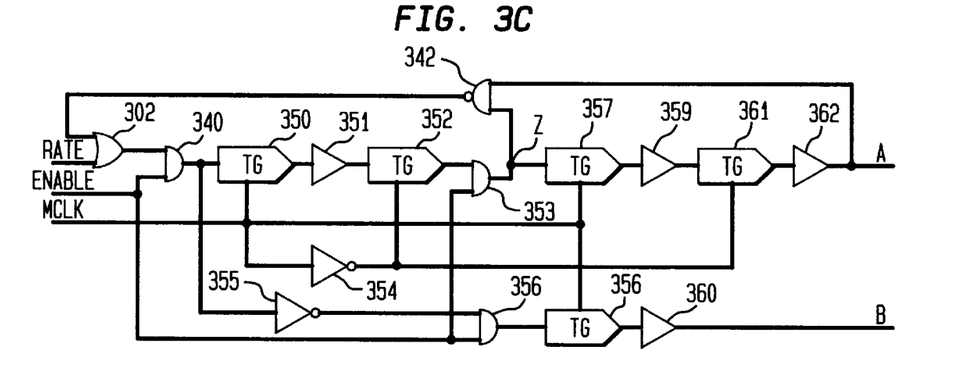
FIG. 3C is a diagram illustrating an alternative embodiment of a counter/divider circuit suitable for use with a clock driver circuit according to the present invention in which a master clock signal is divided by three.

FIG. 3C is a diagram illustrating an alternative embodiment of a counter/divider circuit suitable for use with a clock driver circuit according to the present invention in which a master clock signal is divided by three. As shown in FIG. 3C, AND gates 340, 353 and 356 enable operation of the counter/divider circuit using the ENABLE signal in a similar manner as that described with reference to FIG. 3A. In addition, the OR gate 302 selects clock divide or buffer using the RATE signal in a similar manner as that described with reference to FIG. 3A.

If the signal RATE is logic 0, the clock driver circuit is set to provide the signal CLOCK having a frequency of one third the frequency of the master clock MCLK. The signal A is formed using a count by three operation. At initial start-up, and when the counter/divider circuit is enabled, signal A and signal Z are logic 0. Consequently, NAND gate 342 provides a logic 1 to one terminal of OR gate 302. When the RATE signal provided to the other terminal of OR gate 302 is logic 0, OR gate 302 in turn provides logic 1. Since AND gate 340 is enabled by ENABLE being logic 1, the logic level of OR gate 302, which is logic 1, becomes the logic level of signal Z after two positive transitions of master clock signal MCLK through operation of TGs 350 and 352. These two positive transitions of MCLK also cause the previous logic level of signal Z, which was also logic 0, to appear as the logic level of signal A. Consequently, NAND gate 342 continues to provide a logic 1 to input terminal of OR gate 302. After the next two positive transitions of the master clock MCLK, signals A and Z are both logic 1, and now NAND gate 342 provides a logic 0 to OR gate 302. Consequently, once the initial condition of signal A being logic 0 is followed by the second logic 0, the signal A is now validly provided with the beginning with the second logic 0. As would be apparent to one skilled in the art, signal A's logic sequence becomes logic 1, followed by a second logic 1, and then a logic 0 beginning the next cycle.

Also, note that in the exemplary divide by three counter/divider circuit TGs 350 and 352 delay signal A by half of one master clock cycle with reference to master clock signal MCLK. The logic values are buffered by buffer 351 and AND gate 353, respectively.

Signal B is formed as an inverted signal with respect to signal A by employing inverting the logic level provided by AND gate 340 using inverter 355. Further, the exemplary divide by three counter divider circuit delays signal B with respect to signal A by half of one master clock cycle using TG 358 and buffer 360. In addition, since TGs 350 and 352 delay signal A by half of one master clock cycle with reference to master clock signal MCLK, the half master clock cycle delay of TG 358 and buffer 360 causes signal B to be delayed full one master clock cycle with reference to master clock signal MCLK.

Figure 6B:
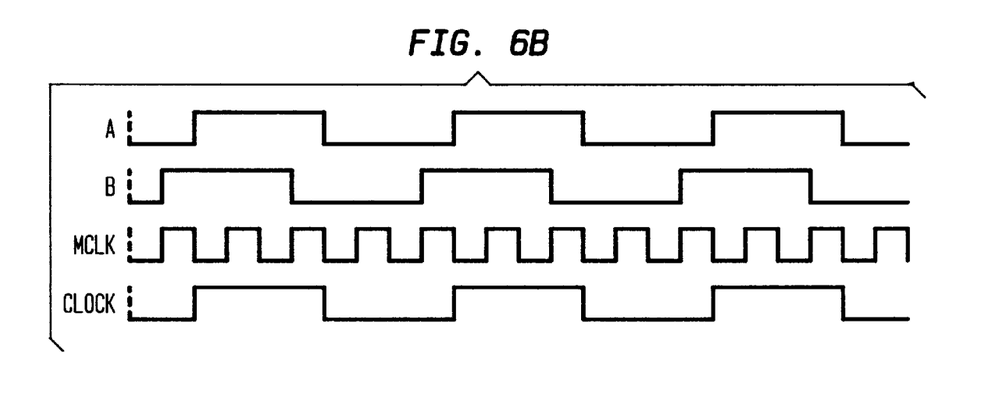
FIG. 6B is a timing diagram illustrating input and output signals in accordance with a further exemplary embodiment of the present invention in which a master clock signal is divided by four.

Similarly, FIG. 6B is a timing diagram illustrating input and output clock signals and including the A and B waveforms, in accordance with another exemplary embodiment of the present invention in which a master clock signal is divided by four.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An integrated circuit having a clock circuit for providing a selected one of a first and a second clock signal corresponding to a first and a second state of an externally generated rate signal, comprising:

a divider configured to generate first and second timing signals derived from a master clock signal and the externally generated rate signal;

a first logic combining circuit which combines the first timing signal with the master clock signal to provide a first signal portion synchronous to the master clock signal;

a second logic combining circuit which combines the second timing signal with an inverted master clock signal to provide a second signal portion synchronous to the master clock signal; and a third logic combining circuit which combines the first and second signal portions to provide the first clock signal when the rate signal is in the first state, and wherein the divider is configured such that the second clock signal has a substantially balanced duty cycle when the rate signal is in the second state.

2. The clock circuit as recited in claim 1, wherein a frequency of the second clock signal is a clock frequency of the master clock signal divided by two, and the dividing circuit comprises:

a selection circuit which provides a base signal, the base signal being the rate signal when the rate signal is in the first state and an inverted first timing signal when the rate signal is in the second state;

a first delay circuit which receives a current and a next value of the base signal responsive to a first and a second cycle of the master clock signal;

a second delay circuit which receives a current and a next value of the inverted first timing signal responsive to a first and a second cycle of the master clock signal, the second delay circuit providing the second timing signal; and a third delay circuit which receives the current value of the base signal from the first delay circuit responsive to an inverted second cycle of the master clock signal when the next value of the base signal is transferred to the first delay circuit responsive to the second cycle of the master clock signal, the third delay circuit providing the first timing signal.

3. The clock circuit as recited in claim 2, wherein the first state and the second state of the rate signal is logic one and logic zero respectively, the selection circuit is an OR gate, each of the first and second delay circuits are first and second transmission gates enabled by the master clock signal transitioning to a logic one value, the third delay circuit is a third transmission gate enabled by the inverted master clock signal transitioning to a logic one value, and each of the first, second and third transmission gates has a respective buffer which successively holds the received current and next values of the base signal.

4. The clock circuit as recited in claim 3, further including a first and a second enabling logic circuit which combine the base signal and the inverted first timing signal respectively with an enabling signal, the enabling signal having a state which disables the first and the second timing signals when applied to the first and the second enabling logic.

5. The clock circuit as recited in claim 4, wherein the first and the second enabling logic circuit is each and AND gate, and the enabling signal state which disables the first and second timing signals is a logic zero.

6. The clock circuit as recited in claim 2, wherein the first, second and third delay circuits further receive a reset signal, the reset signal having a state which sets the first and the second timing signals to a predetermined value when applied to the first, second and third delay circuits.

7. The clock circuit as recited in claim 6, wherein the first and third delay circuits each include an AND gate which combines the reset signal with a respective received value of the base signal, the second delay circuit includes an AND gate which combines the reset signal with a respective received value of the inverted first timing signal, and the reset signal state and the predetermined value are each logic 0.

8. The clock circuit as recited in claim 1, wherein the first and the second logic combining circuits are AND gates, and the third logic combining circuit is an OR gate.

9. The clock circuit as recited in claim 1, wherein the second clock signal is a sub-harmonic of the master clock signal.

10. The clock circuit as recited in claim 1, wherein a frequency of the second clock signal is a clock frequency of the master clock signal divided by three, and the dividing circuit comprises:

a selection circuit which provides a base signal, the base signal being the rate signal when the rate signal is in the first state and an intermediate timing signal when the rate signal is in the second state;

a first delay circuit which receives a current and a next value of the base signal responsive to a first and a second cycle of the master clock signal;

a second delay circuit which receives a current and a next value of the inverted base signal responsive to a first and a second cycle of the master clock signal, the second delay circuit providing the second timing signal;

a third delay circuit which receives the current value of the base signal from the first delay circuit responsive to an inverted second cycle of the master clock signal when the next value of the base signal is transferred to the first delay circuit responsive to the second cycle of the clock signal;

an intermediate logic combining circuit which receives the base signal from the third delay circuit and combines the base signal with the first timing signal to provide the intermediate timing signal;

a fourth delay circuit which receives the current and the next value of the base signal from the third delay circuit responsive to a third and a fourth cycle of the master clock signal; and a fifth delay circuit which receives the current value of the base signal from the fourth delay circuit responsive to an inverted fourth cycle of the master clock signal when the next value of the base signal is transferred to the fourth delay circuit responsive to the fourth cycle of the master clock signal, the fifth delay circuit providing the first timing signal.

11. The clock circuit as recited in claim 10, wherein the first state and the second state of the rate signal is logic one and logic zero respectively, the selection circuit is an OR gate, the intermediate combining logic circuit is a NAND gate, each of the first, second and fourth delay circuits is a transmission gate respectively enabled by the master clock signal transitioning to a logic one value, each of the third and the fifth delay circuits is a transmission gate respectively enabled by the inverted master clock signal transitioning to a logic one value, and each of the first, second, fourth and fifth delay circuits has a corresponding buffer which successively holds the received current and next values of the base signal.

12. The clock circuit as recited in claim 11, further including a first, a second and a third enabling logic circuit which combine the base signal provided by the selection circuit, the inverted base signal and the base signal provided by the third delay circuit respectively with an enabling signal, the enabling signal having a state which disables the first and the second timing signals when applied to the first and the second enabling logic.

13. The clock circuit as recited in claim 12, wherein the first, the second and the third enabling logic circuit is each an AND gate, and the enabling signal state which disables the first and the second timing signal is a logic zero.

14. A method of providing, within an integrated circuit, a selected one of a first and a second clock signal corresponding to a first and a second state of an externally generated rate signal, comprising the steps of:
   a) generating first and second timing signals from a master clock signal and the externally generated rate signal;
   b) mixing (1) the first timing signal with the master clock signal to provide a first signal portion synchronous to the master clock signal, and (2) the second timing signal with an inverted master clock signal to provide a second signal portion synchronous to the master clock signal; and
   c) combining the first and second signal portions to provide (1) the first clock signal when the rate signal is in the first state, and (2) the second clock signal having a substantially balanced duty cycle when the rate signal is in the second state.

15. The method of providing a selected one of a first and a second clock signal as recited in claim 14, wherein a frequency of the second clock signal is a clock frequency of the master clock signal divided by two, and the generating step comprises the steps of:
   a(1) supplying a base signal which is (1) equivalent to the rate signal when the rate signal is in the first state, and (2) an inverted first timing signal when the rate signal is in the second state;
   a(2) sequentially storing a current and a next value of the base signal and a current and next value of the inverted first timing signal responsive to a first and a second cycle of the master clock signal; and
   a(3) providing (1) the stored current value of the base signal as the first timing signal responsive to an inverted second cycle of the master clock signal and (2) the stored next value of the inverted timing signal as the second timing signal when the next value of the base signal is sequentially stored responsive to the second cycle of the clock signal.

16. The method of providing a selected one of a first and a second clock signal as recited in claim 14, wherein the second clock signal is a sub-harmonic of the master clock signal.

17. Apparatus for providing a selected one of a first and a second clock signal corresponding to a first and a second state of an externally generated rate signal, comprising:
   dividing means for generating first and second timing signals from a master clock signal and the externally generated rate signal;
   first logic combining means for combining the first timing signal with the master clock signal to provide a first signal portion synchronous to the master clock signal;
   second logic combining means for combining the second timing signal with an inverted master clock signal to provide a second signal portion synchronous to the master clock signal; and
   third combining means for combining the first and second signal portions to provide (1) the first clock signal when the rate signal is in the first state, and (2) the second clock signal having a substantially balanced duty cycle when the rate signal is in the second state.

18. The apparatus for providing a selected one of a first and a second clock signal as recited in claim 17, wherein a frequency of the second clock signal is a clock frequency of the master clock signal divided by two, and the dividing means further comprises:
   means for supplying a base signal equivalent to (1) the rate signal when the rate signal is in the first state, and (2) an inverted first timing signal when the rate signal is in the second state; and
   storage means for sequentially storing a current and a next value of the base signal and a current and next value of the inverted first timing signal responsive to a first and a second cycle of the master clock signal,
   wherein the storage means provides (1) the stored current value of the base signal as the first timing signal responsive to an inverted second cycle of the master clock signal and (2) the stored value of the inverted timing signal as the second timing signal when the next value of the base signal is sequentially stored responsive to the second cycle of the clock signal.

19. The apparatus for providing a selected one of a first and a second clock signal as recited in claim 17, wherein the second clock signal is a sub-harmonic of the master clock signal.

20. An integrated circuit having a clock circuit for providing a selected one of first and second clock signals corresponding to first and second states of a rate signal, a frequency of the second clock signal being a clock frequency of a master clock signal divided by two, comprising:
   a dividing circuit for generating first and second timing signals derived from the master clock signal and the rate signal, the dividing circuit comprising:
      1) a selection circuit providing a base signal equivalent to a) the rate signal when the rate signal is in the first state and b) an inverted first timing signal when the rate signal is in the second state;
      2) a first delay circuit receiving current and next values of the base signal responsive to first and second cycles of the master clock signal;
      3) a second delay circuit receiving current and next values of the inverted first timing signal responsive to the first and second cycles of the master clock signal, the second delay circuit providing the second timing signal; and
      4) a third delay circuit receiving the current value of the base signal from the first delay circuit responsive to an inverted second cycle of the master clock signal when the next value of the base signal is transferred to the first delay circuit responsive to the second cycle of the master clock signal, the third delay circuit providing the first timing signal;
   a first logic combining circuit combining the first timing signal with the master clock signal to provide a first signal portion synchronous to the master clock signal;
   a second logic combining circuit combining the second timing signal with an inverted master clock signal to provide a second signal portion synchronous to the master clock signal; and
   a third logic combining circuit combining the first and second signal portions to provide the first clock signal when the rate signal is in the first state, and to provide the second clock signal when the rate signal is in the second state.

21. The invention as recited in claim 20, wherein the first and second states of the rate signal are logic one and logic zero, respectively; the selection circuit is an OR gate; the first and second delay circuits are first and second transmission gates enabled by the master clock signal transitioning to a logic one, the third delay circuit is a third transmission gate enabled by the inverted master clock signal transitioning to a logic one; and each of the first, second, and third transmission gates has a respective buffer which successively holds the received current and next values of the base signal.

22. The invention as recited in claim 21, further including first and second enabling logic circuits combining the base signal and the inverted first timing signal, respectively, with an enabling signal, the enabling signal having a state which disables the first and the second timing signals when applied to the first and second enabling logic circuits.

23. The clock circuit as recited in claim 20, wherein the first, second, and third delay circuits further receive a reset signal, the reset signal having a state which sets the first and the second timing signals to a predetermined value when applied to the first, second, and third delay circuits; and wherein:

the first and third delay circuits are AND gates combining the reset signal with a respective received value of the base signal, and the second delay circuit includes an AND gate which combines the reset signal with a received value of the inverted first timing signal.

24. An integrated circuit having a clock circuit for providing a selected one of first and second clock signals corresponding to first and second states of a rate signal, a frequency of the second clock signal being a clock frequency of a master clock signal divided by three, comprising:

a dividing circuit for generating first and second timing signals derived from a master clock signal and the rate signal; the dividing circuit comprising:
1) a selection circuit providing a base signal equivalent to a) the rate signal when the rate signal is in the first state and b) an intermediate timing signal when the rate is in the second state;
2) a first delay circuit receiving current and next values of the base signal responsive to first and second cycles of the master clock signal;
3) a second delay circuit receiving current and next values of the inverted base signal responsive to the first and second cycle of the master clock signal, the second delay circuit providing the second timing signal;
4) a third delay circuit receiving the current value of the base signal from the first delay circuit responsive to an inverted second cycle of the master clock signal when the next value of the base signal is transferred to the first delay circuit responsive to the second cycle of the clock signal;
5) an intermediate logic combining circuit combining the base signal from the third delay circuit with the first timing signal to provide the intermediate timing signal;
6) a fourth delay circuit receiving the current and next values of the base signal from the third delay circuit responsive to third and fourth cycles of the master clock signal; and
7) a fifth delay circuit receiving the current value of the base signal from the fourth delay circuit responsive to an inverted fourth cycle of the master clock signal when the next value of the base signal is transferred to the fourth delay circuit responsive to the fourth cycle of the master clock signal, the fifth delay circuit providing the first timing signal;

a first logic combining circuit which combines the first timing signal with the master clock signal to provide a first signal portion synchronous to the master clock signal;

a second logic combining circuit which combines the second timing signal with an inverted master clock signal to provide a second signal portion synchronous to the master clock signal; and a third logic combining circuit which combines the first and second signal portions to provide the first clock signal when the rate signal is in the first state, and to provide the second clock signal when the rate signal is in the second state.

25. The clock circuit as recited in claim 24 wherein the first and second states of the rate signal are logic one and logic zero respectively, the selection circuit is an OR gate, the intermediate combining logic circuit is a NAND gate, the first, second, and fourth delay circuits are transmission gates enabled by the master clock signal transitioning to a logic one, the third and fifth delay circuits are transmission gates enabled by the inverted master clock signal transitioning to a logic one, and each of the first, second, fourth and fifth delay circuits has a corresponding buffer which successively holds the received current and next values of the base signal.

26. The clock circuit as recited in claim 25, further including first, second, and third enabling logic circuits combining the base signal provided by the selection circuit, the inverted base signal, and the base signal provided by the third delay circuit, respectively, with an enabling signal, the enabling signal having a state which disables the first and the second timing signals when applied to the first and the second enabling logic circuits.

27. A method of providing, within an integrated circuit, a selected one of first and second clock signals corresponding to first and second states of a rate signal, wherein a frequency of the second clock signal is a clock frequency of a master clock signal divided by two, the method comprising the steps of:

a) generating first and second timing signals from a master clock signal and the rate signal, wherein the step of generating includes the steps of:
a(1) supplying a base signal which is (1) equivalent to the rate signal when the rate signal is in the first state, and (2) an inverted first timing signal when the rate is in the second state;
a(2) sequentially storing a current and a next value of the base signal and a current and next value of the inverted first timing signal responsive to a first and a second cycle of the master clock signal; and
a(3) providing (1) the stored current value of the base signal as the first timing signal responsive to an inverted second cycle of the master clock signal and (2) the stored next value of the inverted timing signal as the second timing signal when the next value of the base signal is sequentially stored responsive to the second cycle of the clock signal;

b) mixing (1) the first timing signal with the master clock signal to provide a first signal portion synchronous to the master clock signal, and (2) the second timing signal with an inverted master clock signal to provide a second signal portion synchronous to the master clock signal; and c) combining the first and second signal portions to provide (1) the first clock signal when the rate signal is in the first state, and (2) the second clock signal when the rate signal is in the second state.

28. Apparatus for providing a selected one of a first and second clock signals corresponding to first and second states of a rate signal, a frequency of the second clock signal being a clock frequency of a master clock signal divided by two, the apparatus comprising:

dividing means for generating first and second timing signals from a master clock signal and the rate signal, the dividing means comprising:
  a) means for supplying a base signal which is equivalent to (1) the rate signal when the rate signal is in the first state, and (2) an inverted first timing signal when the rate is in the second state; and
  b) storage means for sequentially storing a current and a next value of the base signal and a current and next value of the inverted first timing signal responsive to a first and a second cycle of the master clock signal;

first logic combining means for combining the first timing signal with the master clock signal to provide a first signal portion synchronous to the master clock signal;

second logic combining means for combining the second timing signal with an inverted master clock signal to provide a second signal portion synchronous to the master clock signal; and third combining means for combining the first and second signal portions to provide (1) the first clock signal when the rate signal is in the first state, and (2) the second clock signal when the rate signal is in the second state; and wherein the storage means provides (1) the stored current value of the base signal as the first timing signal responsive to an inverted second cycle of the master clock signal and (2) the stored value of the inverted timing signal as the second timing signal when the next value of the base signal is sequentially stored responsive to the second cycle of the clock signal.

* * * * *